(12) United States Patent
Kamishinbara et al.

(10) Patent No.: US 8,681,275 B2
(45) Date of Patent: Mar. 25, 2014

(54) SEMICONDUCTOR DEVICE, DC-TO-DC CONVERTER, AND RECEIVER

(75) Inventors: Takashi Kamishinbara, Kanagawa-ken (JP); Yuichi Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 13/415,988

(22) Filed: Mar. 9, 2012

(65) Prior Publication Data

US 2013/0010199 A1 Jan. 10, 2013

(30) Foreign Application Priority Data

Jul. 6, 2011 (JP) ................................. 2011-150057

(51) Int. Cl.
*H04N 5/14* (2006.01)
*H03K 17/56* (2006.01)

(52) U.S. Cl.
USPC .......................................... 348/720; 327/419

(58) Field of Classification Search
USPC .......................................... 348/720; 327/419
See application file for complete search history.

(56) References Cited

U.S. PATENT DOCUMENTS

| | | | | |
|---|---|---|---|---|
| 6,433,285 | B2* | 8/2002 | Maeda et al. | 174/260 |
| 7,554,209 | B2* | 6/2009 | Satou et al. | 257/786 |
| 2006/0213890 | A1* | 9/2006 | Kooken et al. | 219/130.21 |
| 2011/0156678 | A1 | 6/2011 | Saito et al. | |

FOREIGN PATENT DOCUMENTS

| | | |
|---|---|---|
| JP | 2000-114307 A | 4/2000 |
| JP | 2010-16035 A | 1/2010 |

OTHER PUBLICATIONS

Background Art Information Sheet provided by Applicants, Nov. 28, 2011 (1 page total).

* cited by examiner

*Primary Examiner* — Jefferey Harold
*Assistant Examiner* — Justin Sanders
(74) *Attorney, Agent, or Firm* — Posz Law Group, PLC

(57) ABSTRACT

According to one embodiment, a semiconductor device includes a semiconductor element mounting unit, a first conductor, a semiconductor element, a first connection and a second connection. The first conductor is provided around the semiconductor element mounting unit. The semiconductor element is provided on the semiconductor element mounting unit and includes a first switch element and a second switch element provided parallel to the first switch element. The first connection and the second connection are provided on the first switch element side of an imaginary boundary line obtained by extending a boundary between the first switch element and the second switch element. The first connection and the second connection are electrically connected to the first switch element and the second switch element, respectively, and electrically connected to the first conductor.

14 Claims, 6 Drawing Sheets

SEMICONDUCTOR DEVICE, DC-TO-DC CONVERTER, AND RECEIVER

CROSS-REFERENCE TO RELATED APPLICATIONS

This application is based upon and claims the benefit of priority from Japanese Patent Application No. 2011-150057, filed on Jul. 6, 2011; the entire contents of which are incorporated herein by reference.

FIELD

Embodiments described herein relate generally to a semiconductor device, a DC-to-DC converter, and a receiver.

BACKGROUND

Synchronous rectification step-down DC-to-DC converters are used as high-efficiency power sources. A switching circuit composed of a high-side switch and a low-side switch, for example, is used in this kind of DC-to-DC converter. However, in the DC-to-DC converter, the proportion of the conduction loss on the low-side switch side is increasing as a factor of the efficiency reduction, due to increases in the ON period and current of the low-side switch caused by a decrease in voltage.

DETAILED DESCRIPTION

Figure 1:
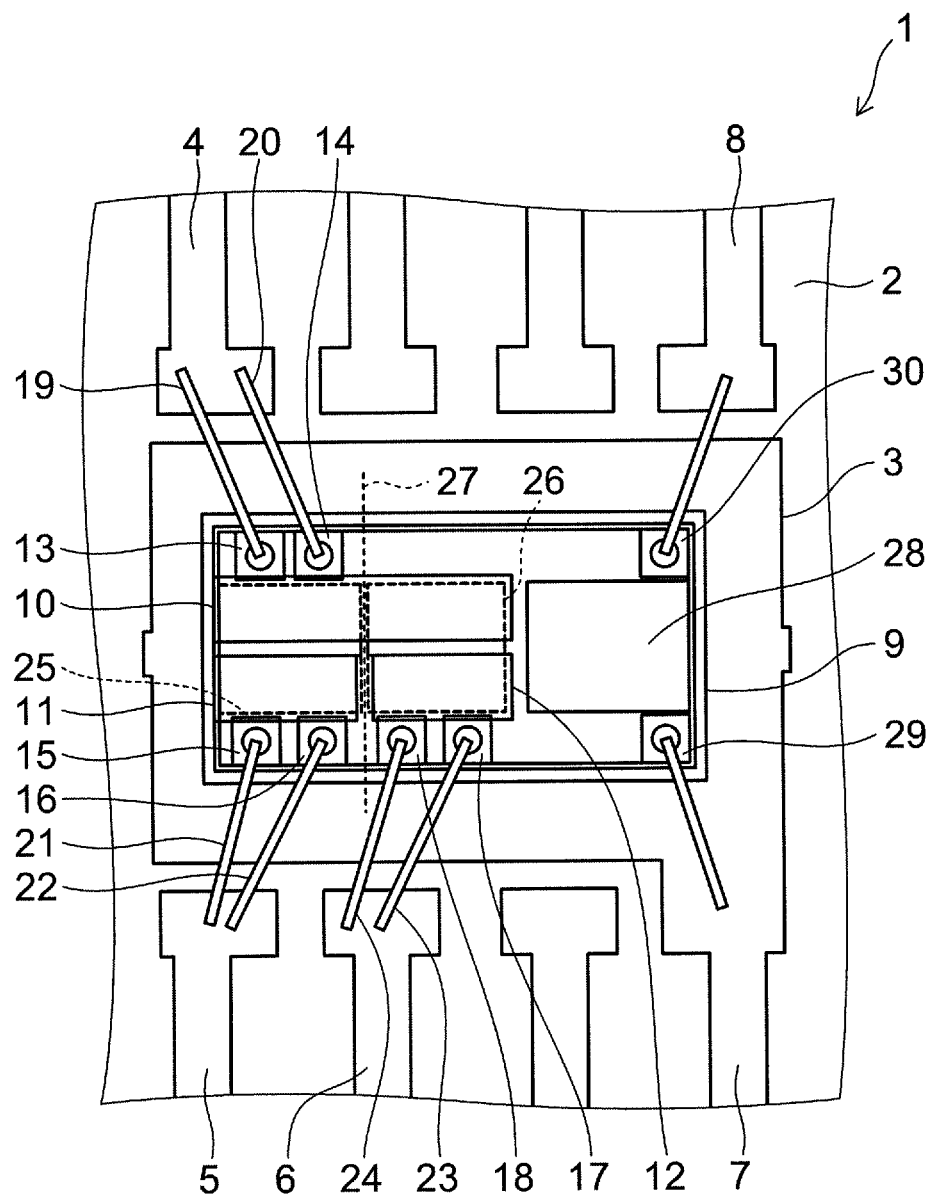
FIG. 1 is a plan view illustrating a configuration of a semiconductor device according to a first embodiment.

In general, according to one embodiment, a semiconductor device includes a semiconductor element mounting unit, a first conductor, a semiconductor element, a first connection and a second connection. The first conductor is provided around the semiconductor element mounting unit. The semiconductor element is provided on the semiconductor element mounting unit and includes a first switch element and a second switch element provided parallel to the first switch element. The first connection and the second connection are provided on the first switch element side of an imaginary boundary line obtained by extending a boundary between the first switch element and the second switch element. The first connection and the second connection are electrically connected to the first switch element and the second switch element, respectively, and electrically connected to the first conductor.

Hereinbelow, embodiments are described in detail with reference to the drawings. The drawings are schematic or conceptual; and the configurations of portions, the relationships between the vertical and horizontal dimensions of portions, the proportions of sizes among portions, etc., are not necessarily the same as the actual ones thereof. Further, the dimensions and proportions may be illustrated differently among drawings, even for identical portions. In the specification of this application and the drawings, components similar to those described in regard to a drawing thereinabove are marked with the same reference numerals, and a detailed description is omitted as appropriate.

First Embodiment

FIG. 1 is a plan view illustrating a configuration of a semiconductor device according to a first embodiment.

As shown in FIG. 1, a semiconductor device 1 includes a semiconductor element mounting unit 3 and a plurality of conductors including a first conductor 4, a second conductor 5, a third conductor 6, and conductors 7 and 8. A semiconductor element 9 is mounted on the semiconductor element mounting unit 3. The semiconductor device 1 has a structure in which the components are placed in a package 2 by, for example, being sealed with a resin or sealed by a can, ceramic case, etc.

The semiconductor element mounting unit 3 is provided almost in the center of the semiconductor device 1. The conductors are provided around the semiconductor element mounting unit 3, and the first conductor 4 is opposed to the second conductor 5 and the third conductor 6. The conductor 7 is connected to the semiconductor element mounting unit 3, and is used as, for example, a ground terminal. Each of the conductors is electrically connected to the semiconductor element 9 via each of a plurality of connections including a first connection 13 and a second connection 14.

In the semiconductor element 9, a first interconnection layer 10 is provided near the first conductor 4. On the first interconnection layer 10, the first connection 13 and the second connection 14 are provided near the first conductor 4. The first connection 13 and the second connection 14 are provided so as to have the shortest distances to the first conductor 4.

In the semiconductor element 9, a first switch element 25 and a second switch element 26 are provided in parallel below the interconnection layers. Here, "in parallel" means that the first switch element 25 and the second switch element 26 are physically in parallel. Both ends of the first switch element 25 are connected to the first interconnection layer 10 and a second interconnection layer 11, respectively. Both ends of the second switch element 26 are connected to the first interconnection layer 10 and a third interconnection layer 12, respectively. The control terminals of the first and second switch elements 25 and 26 are omitted.

The semiconductor element 9 further includes a controller 28 that controls the first switch element 25 and the second switch element 26. The controller 28 is electrically connected to the conductors 7 and 8 via connections 29 and 30, respectively. The controller 28 controls the conduction state or the blocking state of the first switch element 25 and the second switch element 26 by the PWM signal via the connection 30 in accordance with the signal inputted to the conductor 8.

The second interconnection layer 11 is provided near the second conductor 5. On the second interconnection layer 11, third connections 15 and 16 are provided on the first switching element 25 side of an imaginary boundary line 27 obtained by extending the boundary between the first switch element 25 and the second switch element 26 and provided near the second conductor 5. The third connections 15 and 16 are provided so as to have the shortest distances to the second conductor 5.

The third interconnection layer 12 is provided near the third conductor 6. On the third interconnection layer 12, fourth connections 17 and 18 are provided on the second switching element 26 side of the imaginary boundary line 27 and provided near the third conductor 6. The fourth connections 17 and 18 are provided so as to have the shortest distances to the third conductor 6. The first interconnection layer 10 is opposed to the second interconnection layer 11 and the third interconnection layer 12.

The connections are, for example, formed on the interconnection layers as pads.

The first conductor 4 and the first connection 13 are connected by a bonding wire 19. The first conductor 4 and the second connection 14 are connected by a bonding wire 20. The third connections 15 and 16 are connected to the second conductor 5 by bonding wires 21 and 22, respectively. The fourth connections 17 and 18 are connected to the third conductor 6 by bonding wires 23 and 24, respectively.

As mentioned above, the first connection 13 and the second connection 14 are provided on the first interconnection layer 10 in such a manner that the lengths of the bonding wires 19 and 20, respectively, are shortest. The third connections 15 and 16 are provided on the second interconnection layer 11 in such a manner that the lengths of the bonding wires 21 and 22, respectively, are shortest. The fourth connections 17 and 18 are provided on the third interconnection layer 12 in such a manner that the lengths of the bonding wires 23 and 24, respectively, are shortest.

On the first interconnection layer 10, the first connection 13 and the second connection 14 are provided on the first switching element 25 side of the imaginary boundary line 27 obtained by extending the boundary between the first switch element 25 and the second switch element 26. Therefore, the length of the bonding wire 20 connecting the first conductor 4 and the second connection 14 is shorter than that in the case where the second connection 14 is provided on the second switch element 26 side of the boundary line 27.

Thus, the first connection 13 and the second connection 14 are provided nearer to the first switch element 25 is provided nearer than to the second switch element. One end of the first switch element 25 is connected to the first interconnection layer 10, and is electrically connected to the first conductor 4 via the first connection 13 and the second connection 14. The other end of the first switch element 25 is connected to the second interconnection layer 11, and is electrically connected to the second conductor 5 via the third connections 15 and 16. The first switch element 25 causes the first conductor 4 and the second conductor 5 to be connected with electrical continuity or blocked.

The first connection 13 and the second connection 14 are provided farther from the second switch element 26 than from the first switch element 25. One end of the second switch element 26 is connected to the first interconnection layer 10, and is electrically connected to the first conductor 4 via the first connection 13 and the second connection 14. The other end of the second switch element 26 is connected to the third interconnection layer 12, and is electrically connected to the third conductor 6 via the fourth connections 17 and 18. The second switch element 26 causes the first conductor 4 and the third conductor 6 to be connected with electrical continuity or blocked.

In FIG. 1, a configuration is illustrated in which the first conductor 4, and one end of the first switch element 25 and one end of the second switch element 26 are connected via the first connection 13 and the second connection 14. However, the number of second connections 14 is not limited to one, but the second connection 14 may be provided in plural.

Similarly, the second conductor 5 and the other end of the first switch element 25 are connected via the third connections 15 and 16. Furthermore, the third conductor 6 and the other end of the second switch element 26 are connected via the fourth connections 17 and 18. However, the numbers of third connections 15 and 16 and the numbers of fourth connections 17 and 18 are not limited to two but may be arbitrary.

In FIG. 1, each connection and each conductor are connected by each bonding wire. However, it is sufficient that each connection and each conductor can be electrically connected at low resistance, and they may be connected by other connection methods, for example by a conductive plate. For example, the semiconductor element mounting unit 3 and the conductor 7, and the first conductor 4, the second conductor, and the third conductor 6 may be clip-connected.

Second Embodiment

Figure 2:
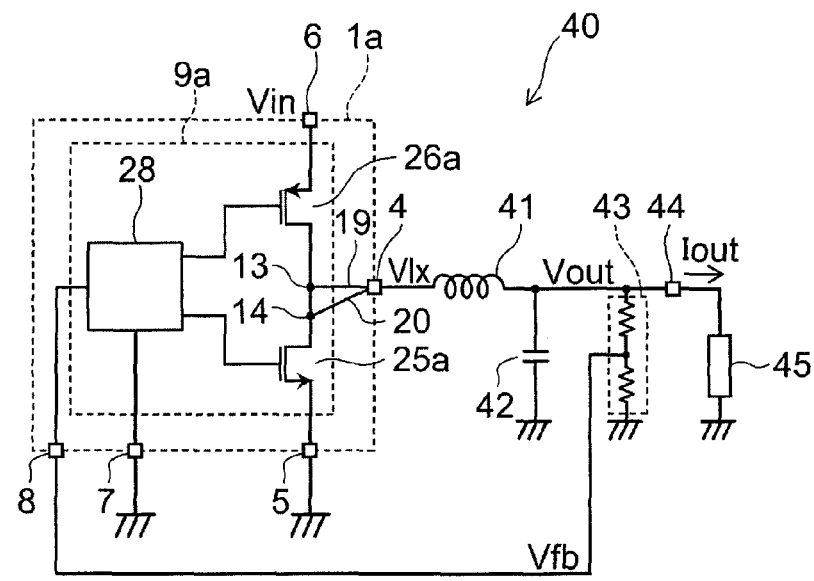
FIG. 2 is a circuit diagram illustrating a configuration of a DC-to-DC converter according to a second embodiment including a semiconductor device according to the first embodiment.

FIG. 2 is a circuit diagram illustrating a configuration of a DC-to-DC converter according to a second embodiment including a semiconductor device according to the first embodiment.

As shown in FIG. 2, a semiconductor device 1a has a configuration in which the semiconductor element 9 of the semiconductor device 1 shown in FIG. 1 is replaced with a semiconductor element 9a.

In the semiconductor element 9a, the first switch element 25 and the second switch element 26 of the semiconductor element 9 are formed of a first switch element 25a of an n-channel MOSFET (hereinafter NMOS) and a second switch element 26a of a p-channel MOSFET (hereinafter PMOS), respectively. Otherwise, the semiconductor element 9a is similar to the semiconductor element 9. The first switch element 25a is a low-side switch, and the second switch element 26a is a high-side switch. In FIG. 2, identical components to FIG. 1 are marked with the same reference numerals.

A drive signal Vlx is outputted from the drains of the first switch element 25a and the second switch element 26a to the first conductor 4. In addition, a signal Vfb is outputted to the controller 28 via the conductor 8. The controller 28 controls the first switch element 25a and the second switch element 26a by PWM signal based on the signal Vfb so that an output voltage Vout may be constant.

The second conductor 5 is connected to the ground as a power ground along with the conductor 7. A power supply voltage Vin is supplied between the third conductor 6 and the second conductor 5.

The source of the first switch element 25a is connected to the ground via the second conductor 5, and the drain is connected to the first conductor 4 and the drain of the second switch element 26a.

The power supply voltage Vin is supplied to the source of the second switch element 26a via the third conductor 6. The gates (control terminals) of the first switch element 25a and the second switch element 26a are connected to the controller 28.

Although a configuration in which the second switch element 26a is a PMOS is illustrated in FIG. 2, the second switch element 26a may be an NMOS. Furthermore, the first switch element 25a and the second switch element 26a may be an IGBT or BJT.

Furthermore, a configuration in which the conductor 7 is provided as a ground terminal separately from the power ground of the second conductor 5 is illustrated in FIG. 2. However, a configuration is also possible in which the second conductor 5 is used as a ground terminal and the conductor 7 is not provided.

A DC-to-DC converter 40 includes the semiconductor device 1a, an inductor 41, a smoothing capacitor 42, and a detector 43. One end of the inductor 41 is connected to the first conductor 4 of the semiconductor device 1a. The other end of the inductor 41 is connected to an output terminal 44. The smoothing capacitor 42 and the detector 43 are connected in parallel between the other end of the inductor 41 and the ground.

The smoothing capacitor 42 smoothes the output voltage Vout generated at the other end of the inductor 41. The detector 43 detects the output voltage Vout, and feeds it back to the semiconductor device 1a as the signal Vfb. Although a configuration in which the detector 43 divides the output voltage Vout with resistances is illustrated in FIG. 2, the output voltage Vout may be returned as the signal Vfb as it is.

A load 45 is connected parallel to the smoothing capacitor 42 between the output terminal 44 and the ground, and an output current Iout flows through the load 45. The conduction loss Pon of the DC-to-DC converter 40 is expressed by equation (1).

$$Pon=(Iout)^2 \times ((Vout/Vin) \times (Ronh-Ronl)+Ronl) \quad (1)$$

where Ronl is the resistance value between the first conductor 4 and the second conductor 5 when the first switch element 25a that is a low-side switch is ON. Ronh is the resistance value between the first conductor 4 and the third conductor 6 when the second switch element 26a that is a high-side switch is ON.

As mentioned above, in the semiconductor device 1a, the interconnection length between the first conductor 4 and one end (the drain) of the first switch element 25a is shorter than the interconnection length between the first conductor 4 and one end (the drain) of the second switch element 26a. The interconnection resistance between the first conductor 4 and the drain of the first switch element 25a is smaller than the interconnection resistance between the first conductor 4 and the drain of the second switch element 26a. Therefore, the loss due to the ON resistance of the first switch element 25a is smaller than the loss due to the ON resistance of the second switch element 26a.

In the case of operating conditions where the step-down ratio (input/output voltage difference) is large, (Vout/Vin)<1 holds and the proportion of the conduction loss due to the ON resistance Ronl on the side of the first switch element 25a increases. Therefore, the semiconductor device 1a can reduce the interconnection resistance of the first switch element 25a to improve the efficiency reduction due to conduction loss increase.

Figure 3:
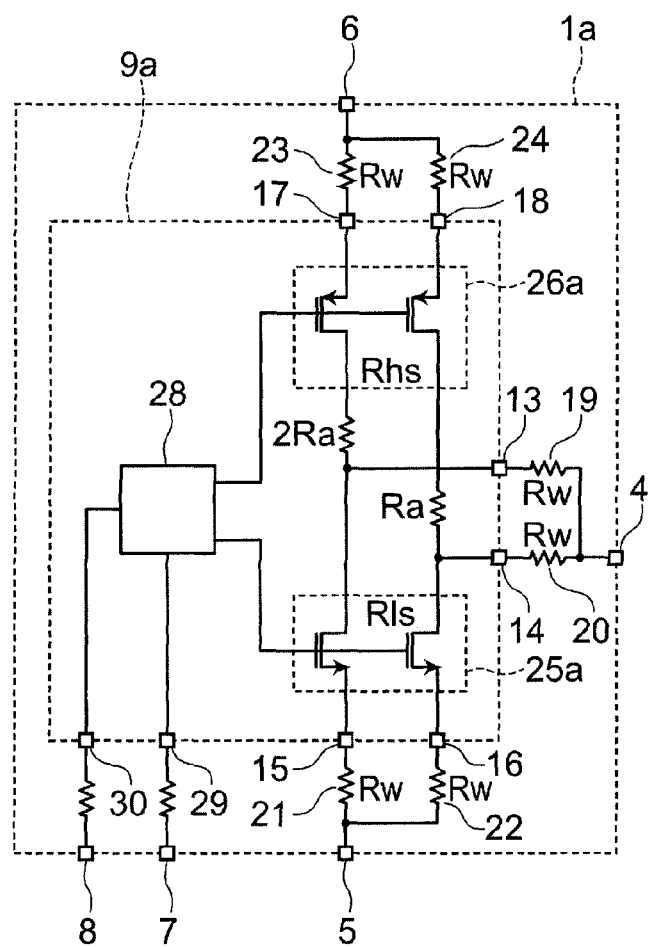
FIG. 3 is an equivalent circuit diagram of the semiconductor device shown in FIG. 2.

FIG. 3 is an equivalent circuit diagram of the semiconductor device shown in FIG. 2.

In FIG. 3, a DC equivalent circuit of the interconnection layers and the bonding wires of the semiconductor device 1a is shown to be simplified.

The first switch element 25a is expressed by two NMOSs connected in parallel. The second switch element 26a is expressed by two PMOSs connected in parallel. Each bonding wire connecting each connection and each conductor is expressed by a resistance with a resistance value of Rw.

In the semiconductor device 1a, one end of the first switch element 25a is provided near the first connection 13 and the second connection 14. One end (the drain) of the second switch element 26a is connected to the first connection 13 and the second connection 14 via the first interconnection layer 10.

Thus, one end of the first switch element 25a, and the first connection 13 and the second connection 14 are connected at a resistance value of 0. Furthermore, one end of the second switch element 26a is connected to the first connection 13 with a resistance with a resistance value of 2Ra, and connected to the second connection 14 with a resistance with a resistance value of Ra.

The resistance value Ronl between the first conductor 4 and the second conductor 5 when the first switch element 25a is ON and the resistance value Ronh between the first conductor 4 and the third conductor 6 when the second switch element 26a is ON are expressed by equation (2) and equation (3), respectively.

$$Ronl=Rls+Rw \quad (2)$$

$$Ronh=Rhs+(Rw+Ra) \times (Rw+2Ra)/(2Rw+3Ra)+Rw/2 \quad (3)$$

where Rls and Rhs are the resistance value of the ON resistance of the first switch element 25a and the resistance value of the ON resistance of the second switch element 26a, respectively.

For example, it is assumed that the resistance value of the ON resistance of the first switch element 25a is Rls=20 mΩ, the resistance value of the ON resistance of the second switch element 26a is Rhs=80 mΩ, the resistance value of each bonding wire is Rw=8 mΩ, and the resistance value between the second connection 14 and one end of the second switch element 26a on the first interconnection layer 10 is Ra=2 mΩ. From equation (2) and equation (3), the resistance value Ronl and Ronh are Ronl=28 mΩ, and Ronh=89.45 mΩ, respectively.

If it is assumed that the DC-to-DC converter 40 has, for example, the values of the power supply voltage Vin=12 V, the output voltage Vout=1.2 V, and the output current Lout=5 A, the conduction loss Pon is Pon=0.854 W from equation (1).

COMPARATIVE EXAMPLE

Figure 4:
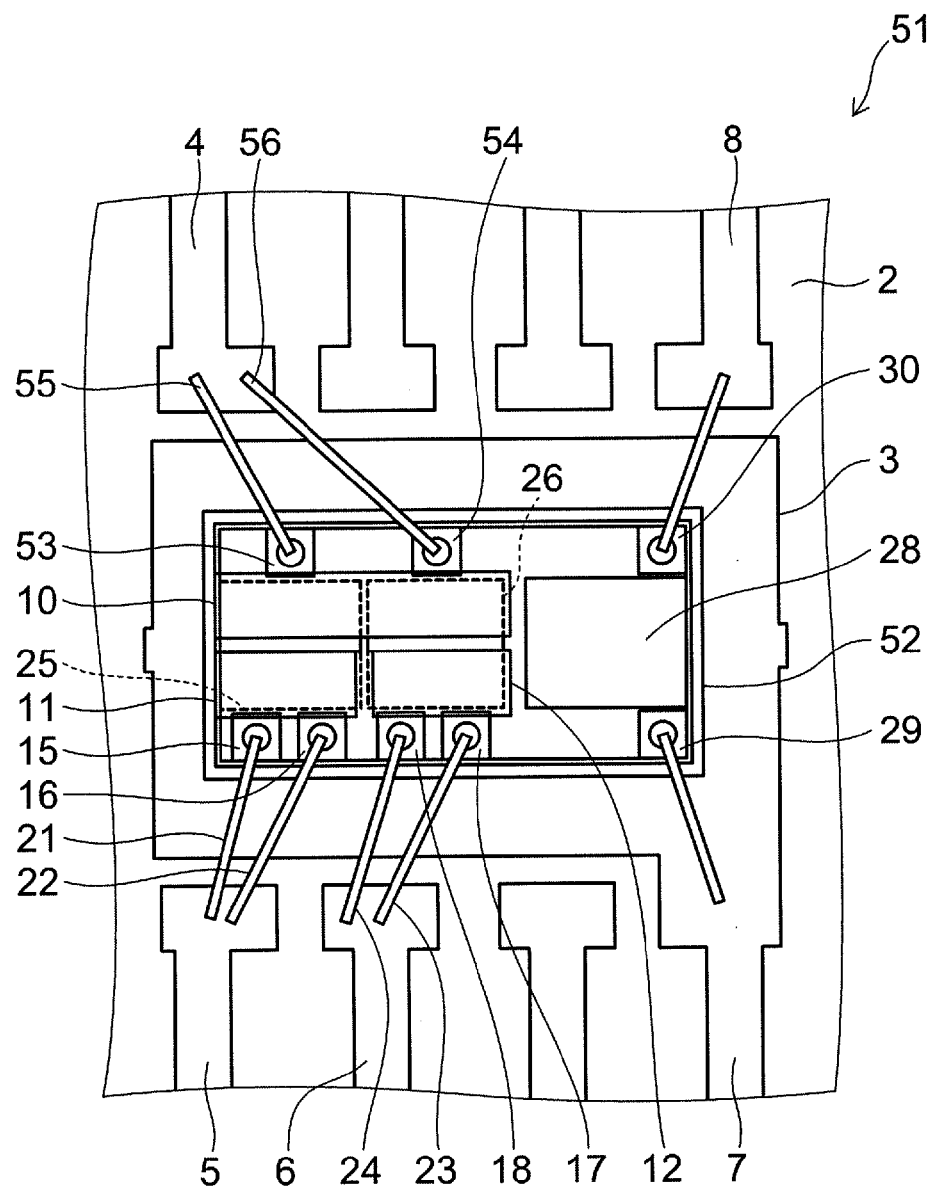
FIG. 4 is a plan view illustrating a configuration of a semiconductor device of a comparative example.

FIG. 4 is a plan view illustrating a configuration of a semiconductor device of a comparative example.

In a semiconductor device 51 of the comparative example, the semiconductor element 9 of the semiconductor device 1 shown in FIG. 1 is replace with a semiconductor element 52. In FIG. 4, identical components to FIG. 1 are marked with the same reference numerals.

In the semiconductor element 52, a second connection 54 is provided on the second switch element 26 side of the imaginary boundary line 27 obtained by extending the boundary between the first switch element 25 and the second switch element 26, on the first interconnection layer 10. On the first interconnection layer 10, the second connection 54 is provided almost in the center of the second switch element 26. Furthermore, on the first interconnection layer 10, a first connection 53 is provided almost in the center of the first switch element 25. The first connection 53 and the second connection 54 are provided in positions almost symmetrical about the boundary line 27.

Thus, the semiconductor device 51 of the comparative example has a configuration in which the resistance value by the interconnection between the first conductor 4 and the first switch element 25 and the resistance value by the interconnection between the first conductor 4 and one end of the second switch element 26 are almost equal.

Accordingly, the length of the bonding wire 55 connecting the first conductor 4 and the first connection 53 is longer than the length of the bonding wire 19 in the semiconductor device 1 shown in FIG. 1. Furthermore, the length of the bonding wire 56 connecting the first conductor 4 and the second connection 54 is longer than the length of the bonding wire 20 in the semiconductor device 1 shown in FIG. 1.

Figure 5:
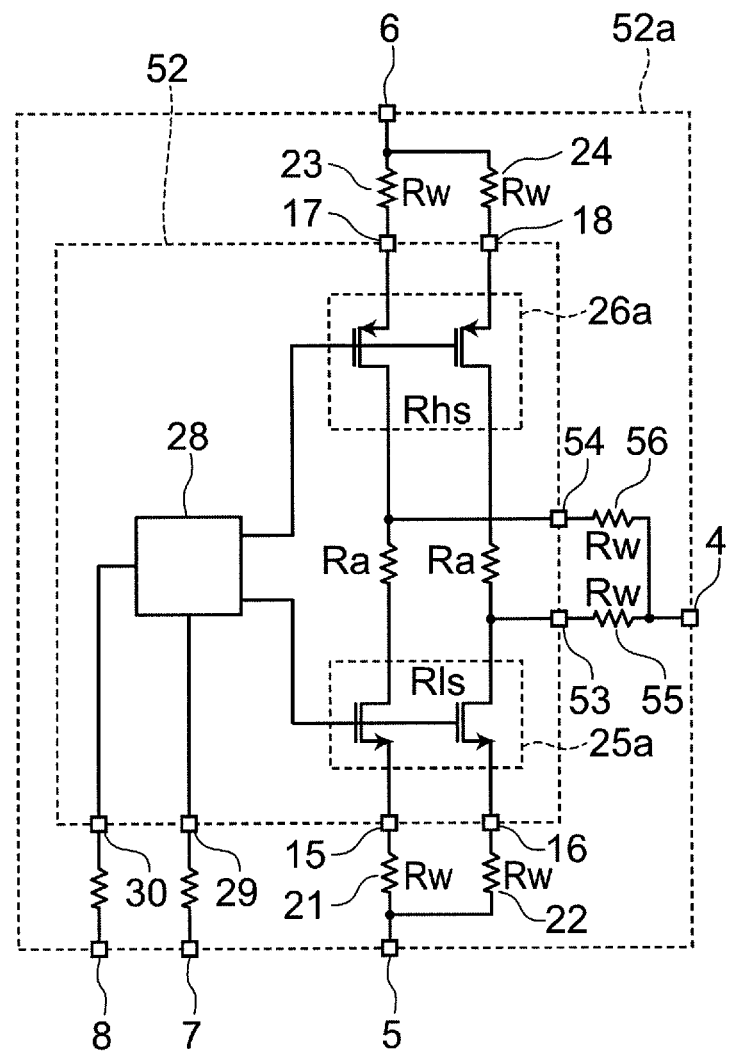
FIG. 5 is an equivalent circuit diagram of a semiconductor device of a comparative example.

FIG. 5 is an equivalent circuit diagram of a semiconductor device of a comparative example.

In FIG. 5, a DC equivalent circuit of the interconnection layers and the bonding wires of a semiconductor device 51a is shown to be simplified. In FIG. 5, identical components to FIG. 3 are marked with the same reference numerals.

In the semiconductor device 51a, one end (the drain) of the first switch element 25a is connected to the first connection 53 at a resistance value of 0, and connected to the second connection 54 at a resistance value of Ra. Similarly, one end (the drain) of the second switch element 26a is connected to the second connection 54 at a resistance value of 0, and connected to the first connection 53 at a resistance value of Ra.

The resistance value Ronl between the first conductor 4 and the second conductor 5 when the first switch element 25a is ON and the resistance value Ronh between the first conductor 4 and the third conductor 6 when the second switch element 26a is ON are expressed by equation (4) and equation (5), respectively.

$$Ronl = Rls + Rw \times (Rw+Ra)/(2Rw+Ra) + Rw/2 \quad (4)$$

$$Ronh = Rhs + Rw \times (Rw+Ra)/(2Rw+Ra) + Rw/2 \quad (5)$$

For example, in the case of the same conditions as the semiconductor device 1a, from equation (4) and equation (5), the resistance values Ronl and Ronh are Ronl=28.44 mΩ, and Ronh=88.44 mΩ, respectively.

Therefore, in the case of the same conditions as the DC-to-DC converter 40, from equation (1), the conduction loss Pon is Pon=0.861 W.

Thus, in the case of conditions where the step-down ratio (input/output voltage difference) is large and (Vout/Vin)=0.1 <1, the ON resistance of the first switch element 25a is set smaller than the ON resistance of the second switch element 26a. Furthermore, by providing the first connection 13 and the second connection 14 near the first conductor 4 like the semiconductor device 1a, the efficiency reduction due to conduction loss can be improved.

In FIG. 1 to FIG. 3, the case of conditions where the step-down ratio is large and (Vout/Vin)<1 is described. However, also in the case of conditions where the step-down ratio is small and (Vout/Vin)>1, the efficiency reduction due to conduction loss can be similarly improved.

It is assumed that the first switch elements 25 and 25a are high-side switches and the second switch elements 26 and 26a are low-side switches. That is, it is assumed that the third conductor 6 is a power ground and the power supply voltage Vin is supplied between the second conductor 5 and the third conductor 6. Also in this case, the ON resistance of the first switch element 25a is set smaller than the ON resistance of the second switch element 26a. Furthermore, by providing the first connection 13 and the second connection 14 near the first conductor 4 like the semiconductor device 1a, the efficiency reduction due to conduction loss can be reduced.

In FIG. 1, a configuration is illustrated in which the first switch element 25 is provided on the end side of the semiconductor element 9 and the second switch element 26 is provided on the inside of the semiconductor element 9. However, the first switch element 25 and the second switch element may be disposed in optimum positions in accordance with the positional relationship between the semiconductor element mounting unit 3 and the first conductor 4 in the semiconductor device 1.

Figure 6:
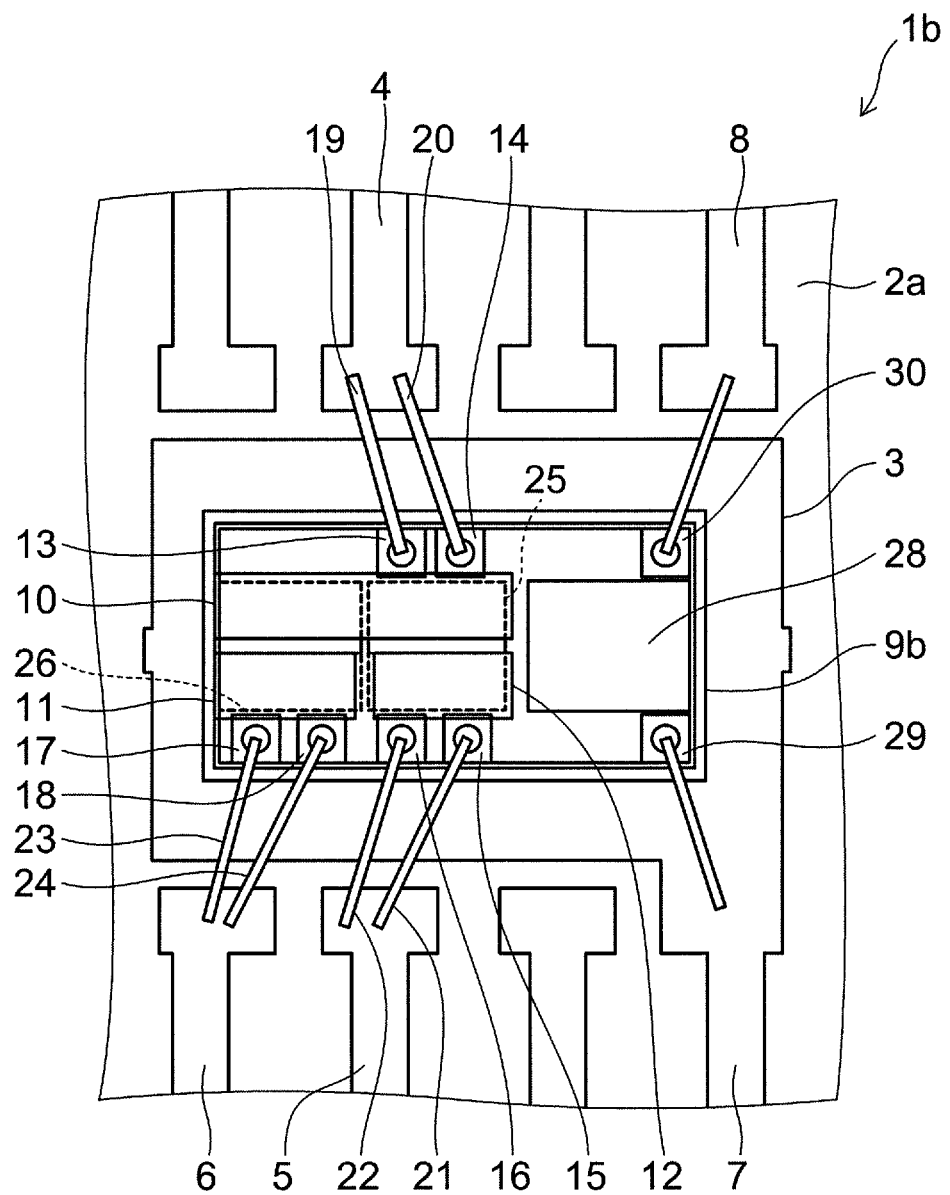
FIG. 6 is a plan view illustrating another configuration of a semiconductor device according to the first embodiment.

FIG. 6 is a plan view illustrating another configuration of a semiconductor device according to the first embodiment.

As shown in FIG. 6, in a semiconductor device 1b, the semiconductor element 9 of the semiconductor device 1 shown in FIG. 1 is replaced with a semiconductor element 9b. Furthermore, the positions of the first conductor 4, the second conductor 5, and the third conductor 6 are different from those of the semiconductor device 1. The semiconductor device 1b has a structure in which the components are placed in the package 2a by, for example, being sealed with a resin or sealed by a can, ceramic case, etc. In FIG. 6, identical components to FIG. 1 are marked with the same reference numerals.

The first conductor 4 has moved from the end side to the inside. In the semiconductor element 9b, the first switch element 25 is moved to the inside of the semiconductor element 9b, and the second switch element 26 is moved to the end of the semiconductor element 9b. In the semiconductor element 9b, the positions of the first switch element 25 and the second switch element 26 of the semiconductor element 9 shown in FIG. 1 are replaced with each other.

The first connection 13 and the second connection 14 are provided on the first switching element 25 side of an imaginary boundary line (not shown) obtained by extending the boundary between the first switch element 25 and the second switch element 26 and provided near the first conductor 4 on the first interconnection layer 10.

The third connections 15 and 16 are provided on the first switching element 25 side of the imaginary boundary line and provided near the second conductor 5 on the second interconnection layer 11. The fourth connections 17 and 18 are provided on the second switching element 26 side of the imaginary boundary line and provided near the third conductor 6 on the third interconnection layer 12.

In the semiconductor device 1b, the first connection 13 and the second connection 14 have moved further to the inside of the semiconductor element 9b than the positions of those in the semiconductor element 9 shown in FIG. 1. Furthermore, the positions of the third connections 15 and 16 and the positions of the fourth connections 17 and 18 in the semiconductor element 9 shown in FIG. 1 are replaced with each other.

Also in the semiconductor device 1b, by providing the first connection 13 and the fourth connection 14 near the first conductor 4, the efficiency reduction due to conduction loss can be improved.

Third Embodiment

Figure 7:
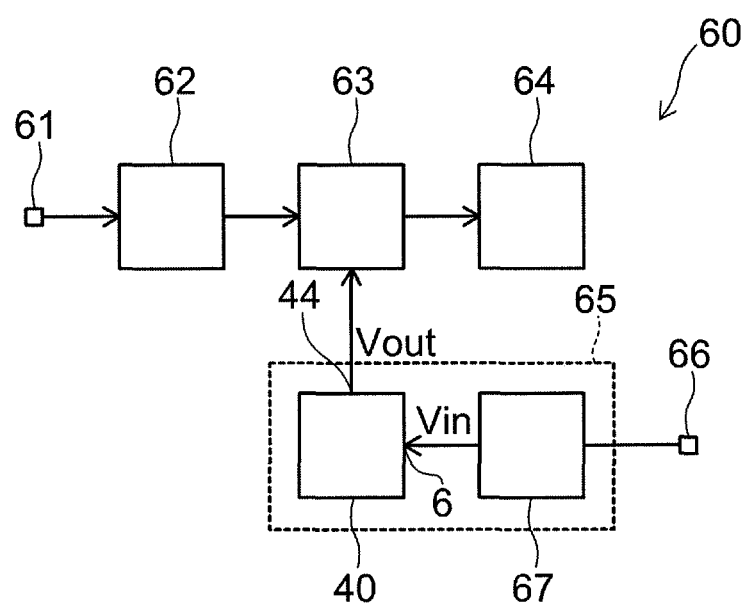
FIG. 7 is a circuit diagram illustrating a configuration of a receiver according to a third embodiment.

FIG. 7 is a circuit diagram illustrating a configuration of a receiver according to a third embodiment.

As shown in FIG. 7, in a receiver 60, a receiving circuit 62 demodulates the radio frequency signal inputted to an antenna terminal 61 into a base band signal. A digital signal processor (digital processor) 63 produces a video signal from the demodulated base band signal. Then, the video signal is displayed by a display unit 64.

A relatively high voltage is supplied to the receiving circuit 62 and the display unit 64. In contrast, the digital signal processor 63 is formed of an element with a low breakdown voltage in order to achieve low power consumption and high-speed processing. A relatively low voltage is supplied to the digital signal processor 63.

In a power supply circuit unit 65, a direct-current power supply circuit 67 generates the power supply voltage Vin of a direct-current from a commercial power source 66. The power supply voltage Vin is stepped down to the output voltage Vout by the DC-to-DC converter 40, and supplied to the digital signal processor 63. The power supply voltage Vin is, for example, 12 V, and the output voltage Vout is, for example, 1.2 V.

The DC-to-DC converter 40 can reduce the interconnection resistance of the first switch element 25a under operating conditions where the step-down ratio is large, and can improve the efficiency reduction due to conduction loss increase. Therefore, the receiver according to the third embodiment can reduce the interconnection resistance to improve the efficiency reduction due to conduction loss.

Although the illustration is omitted, the power supply circuit 65 generates also the voltage supplied to the receiving circuit unit 62 and the display unit 64 from the power supply voltage Vin generated in the direct-current power supply circuit 67.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a semiconductor element mounting unit;
a first conductor provided around the semiconductor element mounting unit;
a semiconductor element provided on the semiconductor element mounting unit and including a first switch element and a second switch element provided parallel to the first switch element; and
a first connection and a second connection provided on the first switch element side of an imaginary boundary line obtained by extending a boundary between the first switch element and the second switch element, electrically connected to the first switch element and the second switch element, respectively, and electrically connected to the first conductor.

2. The device according to claim 1, further comprising:
a second conductor and a third conductor provided around the semiconductor element mounting unit;
a third connection provided on the first switch element side of the imaginary boundary line, the third connection electrically connected to the first switch element and electrically connected to the second conductor; and
a fourth connection provided on the first switch element side of the imaginary boundary line, the fourth connection connected to the second switch element and electrically connected to the third conductor.

3. The device according to claim 2, wherein the third connection and the fourth connection are connected to the second conductor and the third conductor, respectively, each by a bonding wire.

4. The device according to claim 2, wherein the third connection and the fourth connection are connected to the second conductor and the third conductor, respectively, each by a conductive plate.

5. The device according to claim 1, wherein the first connection and the second connection are provided nearer to the first switch element than to the second switch element.

6. The device according to claim 1, wherein the semiconductor element further includes a controller configured to control a conduction state or a blocking state of the first switch element and the second switch element by PWM signal in accordance with a inputted signal.

7. A DC-to-DC converter comprising:
a semiconductor device;
an inductor, one end of the inductor being connected to the semiconductor device;
a smoothing capacitor connected between another end of the inductor and a ground; and
a detector connected between the other end of the inductor and the ground and configured to detect an electric potential of the other end of the inductor and feed the electric potential back to the semiconductor device,
the semiconductor device including:
a semiconductor element mounting unit;
a first conductor provided around the semiconductor element mounting unit and connected to the one end of the inductor;
a semiconductor element provided on the semiconductor element mounting unit and including a first switch element and a second switch element provided parallel to the first switch element; and
a first connection and a second connection provided on the first switch element side of an imaginary boundary line obtained by extending a boundary between the first switch element and the second switch element, electrically connected to the first switch element and the second switch element, respectively, and electrically connected to the first conductor.

8. The converter according to claim 7, further comprising:
a second conductor and a third conductor provided around the semiconductor element mounting unit;
a third connection provided on the first switch element side of the imaginary boundary line, the third connection connected to the first switch element and electrically connected to the second conductor; and
a fourth connection provided on the second switch element side of the imaginary boundary line, the fourth connection connected to the second switch element and electrically connected to the third conductor.

9. The converter according to claim 7, wherein the first connection and the second connection are provided nearer to the first switch element than to the second switch element.

10. The converter according to claim 7, wherein the semiconductor element further includes a controller configured to control a conduction state or a blocking state of the first switch element and the second switch element by PWM signal in accordance with a feedback signal from the detector.

11. A receiver comprising:
a receiving circuit configured to demodulate a radio frequency signal inputted via an antenna terminal into a base band signal;
a digital processor configured to decode the base band signal into a digital data and produce a video signal from decoded digital data;
a display unit configured to display the video signal; and
a DC-to-DC converter configured to supply a power supply voltage to the digital processor,
the DC-to-DC converter including:
a semiconductor device;
an inductor, one end of the inductor being connected to the semiconductor device;
a smoothing capacitor connected between another end of the inductor and a ground; and
a detector connected between the other end of the inductor and the ground and configured to detect an electric potential of the other end of the inductor and feed the electric potential back to the semiconductor device,
the semiconductor device including:
a semiconductor element mounting unit;

a first conductor provided around the semiconductor element mounting unit and connected to the one end of the inductor;

a semiconductor element provided on the semiconductor element mounting unit and including a first switch element and a second switch element provided parallel to the first switch element; and a first connection and a second connection provided on the first switch element side of an imaginary boundary line obtained by extending a boundary between the first switch element and the second switch element, electrically connected to the first switch element and the second switch element, respectively, and electrically connected to the first conductor.

12. The receiver according to claim 11, further comprising:

a second conductor and a third conductor provided around the semiconductor element mounting unit;

a third connection provided on the first switch element side of the imaginary boundary line obtained by extending the boundary between the first switch element and the second switch element, electrically connected to the first switch element, and electrically connected to the second conductor; and a fourth connection connected to the second switch element and electrically connected to the third conductor.

13. The receiver according to claim 11, wherein the first connection and the second connection are provided nearer to the first switch element than to the second switch element.

14. The receiver according to claim 11, wherein the semiconductor element further includes a controller configured to control a conduction state or a blocking state of the first switch element and the second switch element in accordance with a feedback signal from the detector.

* * * * *